United States Patent
Smith et al.

(10) Patent No.: US 6,372,306 B1
(45) Date of Patent: Apr. 16, 2002

(54) FERROELECTRIC MATERIALS WITH CHEMICAL FORMULA $A_{(1-X)}B_XC_{(1-Y)}D_YF_3$, AND FABRICATION THEREOF

(75) Inventors: Robert W. Smith, Omaha, NE (US); James S. Horwitz, Fairfield, VA (US)

(73) Assignee: Board of Regents of the University of Nebraska, Lincoln, NE (US)

( * ) Notice: Subject to any disclaimer, the term of this patent is extended or adjusted under 35 U.S.C. 154(b) by 0 days.

(21) Appl. No.: 09/662,447

(22) Filed: Sep. 14, 2000

Related U.S. Application Data

(60) Provisional application No. 60/154,662, filed on Sep. 20, 1999.

(51) Int. Cl.[7] ................................................. B32B 9/00

(52) U.S. Cl. .................. 427/596; 427/255.11; 427/595

(58) Field of Search ................................ 428/689, 695, 428/697, 702; 427/595, 596, 255.11, 255.21

(56) References Cited

U.S. PATENT DOCUMENTS

| | | |
|---|---|---|
| 3,238,015 A | 3/1966 | Pessakovitz et al. |
| 3,684,727 A | 8/1972 | Phillips |
| 4,482,833 A * | 11/1984 | Weinert et al. ............ 310/313 |
| 5,356,831 A | 10/1994 | Calviello et al. ............ 437/110 |
| 5,378,905 A * | 1/1995 | Nakamura .................. 257/213 |
| 5,442,585 A * | 8/1995 | Eguchi et al. ............... 365/149 |
| 5,552,083 A | 9/1996 | Watanabe et al. ........... 252/309 |
| 5,567,979 A * | 10/1996 | Nashimoto et al. ......... 257/627 |
| 5,667,725 A | 9/1997 | Watanabe et al. ........... 252/309 |
| 5,888,296 A | 3/1999 | Ooms et al. ................. 117/92 |
| 5,889,299 A | 3/1999 | Abe et al. .................... 257/295 |
| 5,889,696 A | 3/1999 | Kawakubo et al. ......... 365/145 |

OTHER PUBLICATIONS

"The Physics Of Ferroelectric Memories", by Auciello, Scott and Ramamoorthy, Physics Today, (Jul. 1998).

"Theory For Forces Between Closed–Shell Atoms and Molecules", Gordon and Kim, J. Chem. Phys., vol. 56, No. 6, (Mar. 1972).

"Phase Transitions In Mixed Alkali Calcium Trifluoride Solid Solutions", Flocken, Smith, Hardy, Stevenson and Swearingen, Mat. Research Bull., Vol 31, No. 9, (1996). No Month.

"Molecular Dynamics Simulation Of Superionicity In Neighboring $NaMgF_3$", Zhou, Hardy and Cao, Geophysical Research Lett., vol. 24, No. 7, (Apr. 1997).

"Synthesis Of Novel Thin–Film Materials By Pulsed Laser Deposition", Lowndes, Geohegan, Puretzky, Norton and Rouleau, Science, Vol 273 (Aug. 1996).

"Thin Film Synthesis Of Metastable And Artificially Structured Oxides", Gupta, Elect. Mat., Curr. Opin. Solid State Mater Sci., Vol 2 (1997). No Month.

(List continued on next page.)

Primary Examiner—Deborah Jones
Assistant Examiner—Abraham Bahta
(74) Attorney, Agent, or Firm—James D. Welch

(57) ABSTRACT

Disclosed are ferroelectric materials with a chemical formula:

$$A_{(1-x)}B_xC_{(1-y)}D_yF_3;$$

such as $NaCaF_3$, or $Na_{1-x}K_xCaF_3$, which are fabricated by deposition of source materials onto a (111) orientation substrate having a cubic lattice constant of between about 3.8 to 4.3 Angstroms, or onto a (001) orientation substrate having a hexagonal a-axis parameter of between about 5.4 to 6.2. A preferred deposition technique is pulsed laser deposition.

9 Claims, 6 Drawing Sheets

OTHER PUBLICATIONS

"Stabilization of $YMnO_3$ In A Perovskite Structure As A Thin Film", Salvador, Doan, Mercey and Raveau, Chem. Mater., vol. 10, No. 10, (1998). No Month.

"Pulsed Laser Ablation Synthesis Of NbNx (0 ( x ( 1.3) Thin Films", Chem. Mater., vol. 6, No. 12, (1994). No Month.

"New Phase Superconducting NbN Stabilized By Heteroeptaxial Film Growth", Phys. Rev. B, vol. 51, No. 14, (Apr. 1995).

"Pulsed Laser Deposition Of Oriented $PbZr_{54}Ti_{46}O_3$", Grabowski, Horwitz, and Chrisey, Ferroelectrics, vol. 116, (1991). No Month.

"Microwave Properties Of $Sr_{0.5}Ba_{0.5}TiO_3$ Thin–Film Interdigitated Capacitors", Kirchoefer, Pond, Carter, Chang, Agrwal, Horowitz and Chrisey, Microwave and Opt. Tech. Lett., vol. 18, No. 3 (Jun. 1998).

"Epitaxial Growth Of Metal Fluoride Thin Films By Pulsed–Laser Deposition", Norton, Budai, Chakoumakos, Geohegan and Puretzky, Mat. Res. Soc. Symp. Proc. vol. 387, (1996). No Month.

"Predicting New Materials", Boyer, Computers in Phys. Vol 8, No. 1, (Jan./Feb. 1994).

"First–Principals Study Of Structural Instabilities In Halide–Based Perovskites: Competition Between Ferroelectricity and Ferroelasticity", Guenther, Hardy, Boyer, Phys. Rev. B, vol. 31, No. 11, (Jun. 1985).

"Ferroelectricity In Perovskites like $NaCaF_3$ Predicted Ab Initio", Phys. Rev. B, Vol 39, No. 13, (May 1989).

"Ferroelectric Phase Transitions In NaCa–Halide Perovskites", Flocken, Guenther, Hardy, Edwardson and Boyer, Phase Transactions, vol. 20, (1990). No Month.

"Ferroelectric Phase Transactions In NA–CA–Halide Perovskites", Flocken, Mei, Guenther, Hardy, Edwardson and Boyer, Ferroelectrics, vol. 104, (1990). No Month.

"Perovskite To Antiperovskite In $ABF_3$ Compounds", Boyer and Edwardson, Ferroelectrics, vol. 104, (1990). No Month.

"The Effect of K Defect Clusters On The Ferroelectric Phase Transition In $NaCaF_3$", Flocken, Mei, Guenther, Hardy and Boyer, Ferroelectrics, vol. 120, (1991). No Month.

"Revised Effective Ionic Tadii and Systematic Studies of Interatomic Distances in Halides and Chalcogenides", Acta Cryst A 32 (1976). No Month.

"New Phase of Superconducting NbN Stabilized by Hetroepitaxial Film Growth", Treece et al., Phys. Rev. B, Vol 51, No. 14 (Apr. 1995). No Month.

"Perovskite To Antiperovskite In $ABF_3$ Compounds", Boyer et al., Ferroelectrics, vol. 104, (1990). No Month.

"The Crossover of Phase Transitions From $NaCaF_3$ to $KCaF_3$", Flocken et al., Ferroelectrics, vol. 120 (1991). No Month.

* cited by examiner

FERROELECTRIC MATERIALS WITH CHEMICAL FORMULA $A_{(1-x)}B_xC_{(1-y)}D_yF_3$, AND FABRICATION THEREOF

This Application is a CIP of Provisional Application Ser. No. 60/154,662 filed Sep. 20, 1999. +gi This invention was made under support provided by Army Research Grant DAAG55-98-1-0273, and under support from the Office of Naval Research. The United States Government might have certain rights in this invention.

TECHNICAL FIELD

The present invention relates to ferroelectric materials and methods for fabrication thereof, and more specifically to ferroelectric materials with a chemical formula:

$$A_{(1-x)}B_xC_{(1-y)}D_yF_3;$$

such as $NaCF_3$, or $Na_{1-x}K_xCaF_3$, or which are fabricated by deposition of source materials onto a substrate with a (111) orientation and a cubic lattice constant of between about 3.8 to 4.3 Angstroms, or a substrate with a (001) orientation and a hexagonal lattice with an a-axis parameter of between about 5.4 to 6.2 Angstroms.

BACKGROUND

It is first to be appreciated that ferroelectric materials are noted for having large permittivities and for demonstrating hysteresis-type retention of residual polarization after an electric field which has been applied, is removed. These properties make ferroelectric materials attractive for application in, for instance, thin film capacitors and random access memories (RAM's), infrared sensors based upon pyroelectric properties, and possibly thermal infra-red switches based on electro-optic properties, as well as microactuators based upon piezoelectric properties.

All ferroelectric materials are related by having noncentrosymmetric crystalline structure and attendant polarization due to displacement of metal cations from the center of their respective coordination spheres. Many ferroelectric materials with formulae $ABX_3$ occur in distorted perovskite structures composed of octahedra connected through shared vertices. Typically small, highly charged, metal cations, (such as $Ti^{4+}$) are located within the octahedra and large cations, (such as $Ba^{2+}$), are located in the spheres between octahedra. Polarization occurs when the small cation is displaced toward one corner or face of the octahedral environment. $BaTiO_3$ is the archetypical ferroelectric material of this variety.

Because ferroelectric properties are related to noncentrosymmetric crystalline structure, phase transitions to higher symmetry centrosymmetric structures typically destroy their ferroelectric properties. Consequently, most ferroelectric materials have a phase transition Curie temperature (Tc), above which the materials no longer act as a ferroelectric, but might retain good dielectric properties.

It is also noted that most ferroelectric materials are oxides and are opaque in ultraviolet spectral region. A ferroelectric material which is transparent in the ultraviolet spectral region could therefore provide additional utility, and, as taught by the present invention, candidates for such a ferroelectric material include fluorides.

Continuing, as early as 1984 Dr. J. W. Flocken, Dr. R. A. Guenther at the University of Nebraska at Omaha, and Dr. L. L. Boyer of the Naval Research Lab determined that of approximately sixty (60) halide-based perovskites of the form $ABX_3$, where A is an alkali metal, and B is an alkaline earth metal, and X is a halogen, three (3) were candidates for study as ferroelectrics. One of these compounds is $NaCaF_3$. This is because $NaCaF_3$ was determined to be of a distorted perovskite structure, the distortion being from a cubic symmetry to a rhombohedral symmetry by elongation along the cubic body-centered diagonal. The body-diagonal of the cubic cell being the trigonal axis of the ferroelectric structure, along which polarization is expected to occur by displacement of sodium cations and fluoride anions in opposite directions from the cubic geometry.

In view of the potential benefits associated with $NaCaF_3$, several attempts to fabricate $NaCaF_3$ over a period of years were made, however, none produced results. Unsuccessful approaches included solid-state co-precipitation, freeze-drying, and decomposition reactions.

With the present invention in mind, a Search of Patents was performed, with the result being that very little was found. Perhaps the best reference is U.S. Pat. No. 3,238,015 to Pessahovitz et al., which describes the preparation of $KMgF_2$ by dissolving thixotropic $MgF_2$ in a hot solution of KF. The resultant material, however, is not identified as being ferroelectric. Another U.S. Pat. No. 3,682,727 to Phillips describes fabrication of photochromic materials by melting $CaF_2$, $LaF_2$ and NaF in a crucible at between 630 and 725 degrees Centigrade. U.S. Pat. No. 5,888,296 to Ooms et al. describes formation of a layer of ferroelectric bismuth on a lattice matched semiconductor. U.S. Pat. Nos. 5,667,725 and 5,552,083 to Wanatabe et al. describe the preparation of colloidal $NaFMgF_2$. A U.S. Pat. No. 5,356,831, to Calveillo et al., describes lattice matching a semiconductor to a substrate such as MgO with a lattice constant in the range of three (3) to six (6) Angstroms. Recent Patents which describe application of ferroelectric materials in thin film capacitors and RAM devices are U.S. Pat. Nos. 5,889,299 and 5,889,696.

In addition, a number of Scientific Papers have been identified as follows:

"The Physics Of Ferroelectric Memories", by Auciello, Scott and Ramamoorthy, Physics Today, (July 1998).

"Theory For Forces Between Closed-Shell Atoms And Molecules", Gordon and Kim, J. Chem. Phys., Vol. 56, No. 6, (March 1972).

"Phase Transitions In Mixed Alkali Calcium Trifluoride Solid Solutions", Flocken, Smith, Hardy, Stevenson and Swearingen, Mat. Research Bull., Vol 31, No. 9, (1996).

"Molecular Dynamics Simulation Of Superionicity In Neighboring $NaMgF_3$", Zhou, Hardy and Cao, Geophysical Research Lett., Vol. 24, No. 7, (April 1997).

"Synthesis Of Novel Thin-Film Materials By Pulsed Laser Deposition", Lowndes, Geohegan, Puretzky, Norton and Rouleau, Science, Vol 273 (August 1996).

"Thin Film Synthesis Of Metastable And Artificially Structured Oxides", Gupta, Elect. Mat., Curr. Opin. Solid State Mater Sci., Vol 2 (1997).

"Stabilization of $YMnO_3$ In A Perovskite Structure As A Thin Film", Salvador, Doan, Mercey and Raveau, Chem. Mater., Vol. 10, No. 10, (1998).

"Pulsed Laser Ablation Synthesis Of NbNx (0 (x (1.3) Thin Films", Chem. Mater., Vol. 6, No. 12, (1994).

"New Phase Superconducting NbN Stabilized By Heteroeptaxial Film Growth", Phys. Rev. B, Vol. 51, No. 14, (April 1995).

"Pulsed Laser Deposition Of Oriented $PbZr_{54}Ti_{46}O_3$", Grabowski, Horwitz, and Chrisey, Ferroelectrics, Vol. 116, (1991).

"Microwave Properties Of $Sr_{0.5}Ba_{0.5}TiO_3$ Thin-Film Interdigitated Capacitors", Kirchoefer, Pond, Carter, Chang, Agrwal, Horowitz and Chrisey, Microwave and Opt. Tech. Lett., Vol. 18, No. 3 (June 1998).

"Epitaxial Growth Of Metal Fluoride Thin Films By Pulsed-Laser Deposition", Norton, Budai, Chakoumakos, Geohegan and Puretzky, Mat. Res. Soc. Symp. Proc. Vol. 387, (1996).

"Predicting New Materials", Boyer, Computers in Phys. Vol 8, No. 1, (January/February 1994).

"First-Principals Study Of Structural Instabilities In Halide-Based Perovskites: Competition Between Ferroelectricity and Ferroelasticity", Guenther, Hardy, Boyer, Phys. Rev. B, Vol. 31, No. 11, (June 1985).

"Ferroelectricity In Perovskites like $NaCaF_3$ Predicted Ab Initio", Phys. Rev. B, Vol 39, No. 13, (May 1989).

"Ferroelectric Phase Transitions In NaCa-Halide Perovskites", Flocken, Guenther, Hardy, Edwardson and Boyer, Phase Transactions, Vol. 20, (1990).

"Ferroelectric Phase Transactions In NA-CA-Halide Perovskites", Flocken, Mei, Guenther, Hardy, Edwardson and Boyer, Ferroelectrics, Vol. 104, (1990).

"Perovskite To Antiperovskite In $ABF_3$ Compounds", Boyer and Edwardson, Ferroelectrics, Vol. 104, (1990).

"The Effect Of K Defect Clusters On The Ferroelectric Phase Transition In $NaCaF_3$", Flocken, Mei, Guenther, Hardy and Boyer, Ferroelectrics, Vol. 120, (1991).

"Revised Effective Ionic Tadii and Systematic Studies of Interatomic Distances in Halides and Chalcogenides", Acta Cryst A 32 (1976).

"New Phase of Superconducting NbN Stabilized by Hetroepitaxial Film Growth", Treece et al., Phys. Rev. B, Vol 51, No. 14 (April 1995).

"Perovskite to Antiperovskite in $ABF_3$ Compounds", Boyer et al., Ferroelectrics, Vol. 104, (1990).

"The Crossover of Phase Transitions From $NaCaF_3$ to $KCaF_3$", Flocken et al., Ferroelectrics, Vol. 120 (1991).

Even in view of the literature, a need remains for a method by which ferroelectric materials with a chemical formula: $A_{(1-x)}B_xC_{1-y)}D_yF_3$; such as $NaCaF_3$ or $Na_{1-x}K_xCaF_3$ can be fabricated.

DISCLOSURE OF THE INVENTION

The present invention is primarily ferroelectric $NaCaF_3$, which has a Crystalline Structure similar to $LiNbO_3$, (eg. perovskite with distortion away from cubic toward rhombohedral), produced by deposition of NaF and $CaF_2$ onto a lattice matched substrate, wherein use of a lattice matching substrate is essential to overcome adverse thermodynamic forces.

To the Inventor's knowledge no-one has ever before fabricated even thin-film $NaCaF_3$, although theory has existed for some time which predicts that, were its fabrication found to be possible, the result would be Ferroelectric. Recently, however, Inventor, Dr. Robert Smith, a Naval Reservist and Researcher at the University of Nebraska at Omaha, utilizing Pulsed Laser Deposition (PLD) techniques at the Naval Research Lab (NRL) in Washington D.C. under an Army Research Grant, successfully fabricated thin films of $NaCaF_3$ on a (111) orientation MgO substrate. Said (111) orientation MgO substrate was suggested by Dr. J. S. Horwitz, a civilian employee at the NRL. It is noted that other deposition techniques should also work, and that (111) orientation $SrZrO_3$ substrate would probably be preferable as a substrate, based upon cubic lattice dimensions. (111) orientation $SrZrO_3$, however, is not readily available in a form adaptable for use as a substrate. Other possible substrate candidates include (111) orientation SrTiO3 which has an a-axis parameter of 3.905, (111) orientation Au, and generally any (111) orientation substrate with a cubic lattice constant of between about 3.8 to 4.3 Angstroms, or any (001) orientation substrate with a hexagonal a-axis parameter of between 5.4 and 6.2 Angstroms.

In work performed to date, said (111) orientation MgO substrate was utilized because its cubic lattice constant acts as a thermodynamic stability providing template upon which thin film $NaCaF_3$ can be achieved. Again however, in general, any substrate with a (111) orientation and cubic lattice constant of between about 3.8 to 4.3 Angstroms, (nominally about 4.05), or any substrate with a (001) orientation hexagonal lattice with an a-axis parameter of between about 5.4 to 6.2, (nominally about 5.8) is applicable. It is noted that bulk $NaCaF_3$ has yet to be fabricated, and the difficulty in doing so is most likely because of thermodynamic instabilities associated with tertiary fluorides.

The present invention is generally a ferroelectric material having a formula $A_{(1-x)}B_xC_{1-y}D_yF_3$; where A and B are each independently selected from Periodic Chart Group IA, and said C and D are each independently selected from Periodic Chart Group IIA, said ferroelectric material being in functional combination with a substrate with a substantially lattice matching substrate.

As specific examples said present invention ferroelectric material can provide that:

A is Sodium (Na);

x=0.0;

C is Calcium (Ca); and y=0.0;

and said substrate is selected from the group consisting of:
(111) orientation MgO;
(111) orientation $SrZrO_3$;
(111) orientation $SrTiO_3$;
(111) orientation Au;
a (111) orientation substrate with a cubic lattice constant between about 3.8 and 4.3 Angstroms; and
a (001) orientation substrate with a hexagonal a-axis parameter of between about 5.4 and 6.2 Angstroms.

As further specific examples said present invention ferroelectric material can provide that:

A is Sodium (Na);

B is Potassium (K);

x is between 0.0 and 1.0;

C is Calcium (Ca); and

D is selected from the group consisting of a member of the Periodic Chart Group IIA; and being absent; and y is between 0.0 and 1.0;

and said substrate is selected from the group consisting of:
(111) orientation MgO;
(111) orientation $SrZrO_3$;
(111) orientation $SrTiO_3$;
(111) orientation Au;
a (111) orientation substrate with a cubic lattice constant between about 3.8 and 4.3 Angstroms; and
a (001) orientation substrate with a hexagonal a-axis parameter of between about 5.4 and 6.2 Angstroms.

A present invention method of fabricating a ferroelectric material having a formula $A_{(1-x)}B_xC_{(1-y)}D_yF_3$;

where A and B are each characterized by a selection from the group consisting of:

each being independently selected from Periodic Chart Group IA;

one being selected from Periodic Chart Group IA and the other being absent;

and said C and D are each characterized by a selection from the group consisting of:

each being independently selected from Periodic Chart Group IIA;

one being selected from Periodic Chart Group IIA and the other being absent;

said ferroelectric material being in functional combination with a substrate selected from the group consisting of:
- (111) orientation Au;
- a (111) orientation substrate with a cubic lattice constant between about 3.8 and 4.3 Angstroms; and
- a (001) orientation substrate with a hexagonal a-axis parameter of between about 5.4 and 6.2 Angstroms;

said method comprising the steps of:
a. providing a pulsed laser deposition system;
b. placing target containing A and C, and optionally B and/or D into said pulsed laser deposition system;
c. placing a selected substrate into said pulsed laser deposition system;
d. causing pulses of laser energy to ablate said target containing A and C, and optionally B and/or D to the end that ablated A and C, and optionally B and/or D deposit onto said substrate.

The present invention further includes a ferroelectric material having a formula $$A_{(1-x)}B_xC_{(1-y)}D_yF_3;$$

where A and B are each characterized by a selection from the group consisting of:

each being independently selected from Periodic Chart Group IA;

one being selected from Periodic Chart Group IA and the other being absent;

and said C and D are each characterized by a selection from the group consisting of:

each being independently selected from Periodic Chart Group IIA;

one being selected from Periodic Chart Group IIA and the other being absent;

said ferroelectric material being in functional combination with a substrate selected from the group consisting of:
- (111) orientation Au;
- a (111) orientation substrate with a cubic lattice constant between about 3.8 and 4.3 Angstroms; and
- a (001) orientation substrate with a hexagonal a-axis parameter of between about 5.4 and 6.2 Angstroms;

which is fabricated by the method recited infra herein.

A preferred present invention ferroelectric material has a formula $NaCaF_3$ and is a thin film in functional combination with a surface of a substrate, said substrate being selected from the group consisting of:
- (111) orientation MgO;
- (111) orientation $SrZrO_3$;
- (111) orientation $SrTiO_3$;
- (111) orientation Au;
- a (111) orientation substrate with a cubic lattice constant between about 3.8 and 4.3 Angstroms; and
- a (001) orientation substrate with a hexagonal a-axis parameter of between about 5.4 and 6.2 Angstroms.

Another present invention material, which so far has not demonstrated ferroelectric properties, has a formula comprising $KCaF_3$ and is a thin film in functional combination with a surface of a substrate, said substrate being selected from the group consisting of:
- (111) orientation MgO;
- (111) orientation $SrZrO_3$;
- (111) orientation $SrTiO_3$;
- (111) orientation Au;
- a (111) orientation substrate with a cubic lattice constant between about 3.8 and 4.3 Angstroms; and
- a (001) orientation substrate with a hexagonal a-axis parameter of between about 5.4 and 6.2 Angstroms.

Additionally, a present invention ferroelectric material has a formula $Na_{(1-x)}K_xCaF_3$ and is a thin film in functional combination with a surface of a substrate, said substrate being selected from the group consisting of:
- (111) orientation MgO;
- (111) orientation $SrZrO_3$;
- (111) orientation $SrTiO_3$;
- (111) orientation Au;
- a (111) orientation substrate with a cubic lattice constant between about 3.8 and 4.3 Angstroms; and
- a (001) orientation substrate with a hexagonal a-axis parameter of between about 5.4 and 6.2 Angstroms.

The present invention also includes a ferroelectric material having a formula $$A_{(1-x)}B_xC_{(1-y)}D_yF_3;$$

where A and B are each characterized by a selection from the group consisting of:

each being independently selected from Periodic Chart Group IA;

one being selected from Periodic Chart Group IA and the other being absent;

and said C and D are each characterized by a selection from the group consisting of:

each being independently selected from Periodic Chart Group IIA;

one being selected from Periodic Chart Group IIA and the other being absent;

which is characterized by X-ray diffraction fingerprint results corresponding to the presence of material(s) inherent in $$A_{(1-x)}B_xC_{(1-y)}D_yF_3;$$

The present invention will be better understood by reference to the Detailed Description Section of this Disclosure, in conjunction with the Drawings.

SUMMARY OF THE INVENTION

It is therefore a primary object and/or purpose of the present invention to teach ferroelectric materials with a chemical formula:

$$A_{(1-x)}B_xC_{(1-y)}D_yF_3;$$

such as $NaCaF_3$, or $Na_{1-x}K_xCaF_3$, which are fabricated by, for instance, deposition of source materials onto a substrate with a (111) orientation and a cubic lattice constant of between about 3.8 to 4.3 Angstroms, (eg. Au), or a substrate with a (001) orientation and a hexagonal lattice with an a-axis parameter of between about 5.4 to 6.2 Angstroms.

It is another object and/or purpose of the present invention to teach a ferroelectric material, such as $NaCaF_3$, which is formed by a pulsed laser technique.

DETAILED DESCRIPTION

Present invention thin-film $NaCaF_3$ was fabricated utilizing a Pulsed Laser Deposition (PLD) technique. PLD comprises causing a laser to ablate a typically rotating target of desired material to create a plume of the same stoichiometric ratio as is the target. Presently reported work utilized a target composed of NaF and $CaF_2$, because no bulk target of $NaCaF_3$ is available. Atoms in an ablation created plume, subsequently deposit onto a substrate which is oriented at approximately three (3) to five (5) centimeters from the target. Of course, varying experimental conditions such as pressure, temperature, fluence etc. during a laser ablation procedure affect the results obtained.

In more detail, the present invention experimental fabrication work involved providing commercially polished (111) orientation MgO which has a cubic cell lattice constant of 4.2112 Angstrom. This substrate was chosen as it is available, and provides a good match to the predicted pseudo-cubic cell lattice constant for $NaCaF_3$, of 4.299 Angstrom. The (111) orientation was chosen as being most conducive for growth of the material with its rhombohedral axis (the expected polarization axis), normal to the substrate surface. The substrates were used "as-is" and were mounted in a vacuum chamber system on a heating block using silver paint. Targets were prepared from finely ground stoichiometric mixtures of NaF and $CaF_2$ that were pressed into two (2) centimeter pellets and sintered at one-thousand-seventy (1070) degrees Kelvin for three hours under flowing Argon.

A PLD system much as utilized in the present work, is shown in

Figure 1A:
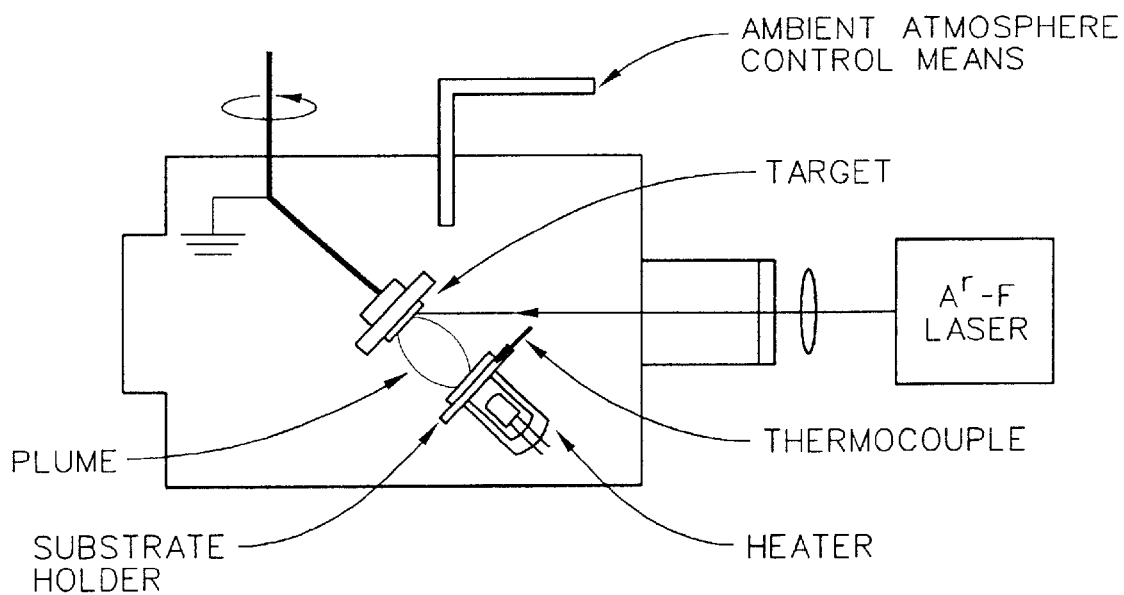
FIG. 1a demonstrates a pulsed laser deposition (PLD) system.
Figure 1B:
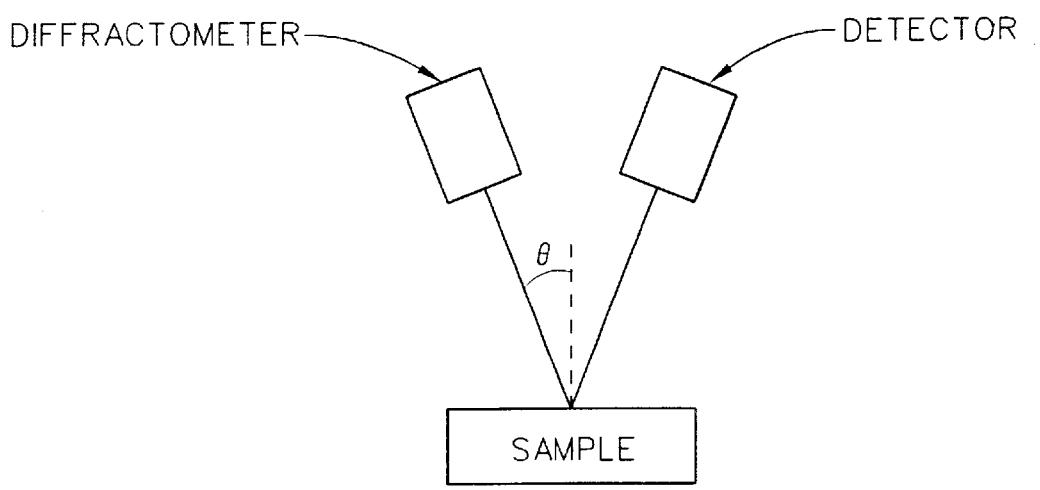
FIG. 1b demonstrates an X-ray diffraction (XRD) system.

FIG. 1a as comprising a rotatable stage upon which is mounted a target, a substrate holder, a heater and thermocouple, a means for controlling ambient atmosphere, and a laser source. Also indicated is a plume which is generated by impinging a laser beam onto the target, said plume also being shown to contact a substrate and so deposit material in the plume thereupon.

Table 1, provides important fabrication parameter values:

TABLE 1

| LASER TYPE | ArF EXIMER |
|---|---|
| LASER WAVELENGTH | 193 NM |
| PULSE DURATION | 30 NS |
| FREQUENCY | 5 HZ |
| SPOT SIZE | 0.065–0.080 $CM^2$ |
| FLUENCE | 1.4–1.9 $J/CM^2$ |
| TARGET | 1:1 MOLAR $NaF/CaF_2$ |
| SUBSTRATE | (111) Orientation MgO |
| SUBSTRATE TEMPERATURE | 1020–1030 K. |
| AMBIENT PRESSURE | 2.7 PA ARGON |
| TARGET-SUBSTRATE DISTANCE | 4.7–5.0 CM |

Fabrication parameter values were varied to optimize crystalline quality as determined by X-ray diffraction, (XRD). XRD was conducted utilizing a Rigaku system equipped with a rotating copper anode and a graphite monochromator set for Cu K A-radiation for both 2θ-θ and ω-scans. An XRD system is basically demonstrated in

FIG. 1b.

Also presented in

Figure 1C:
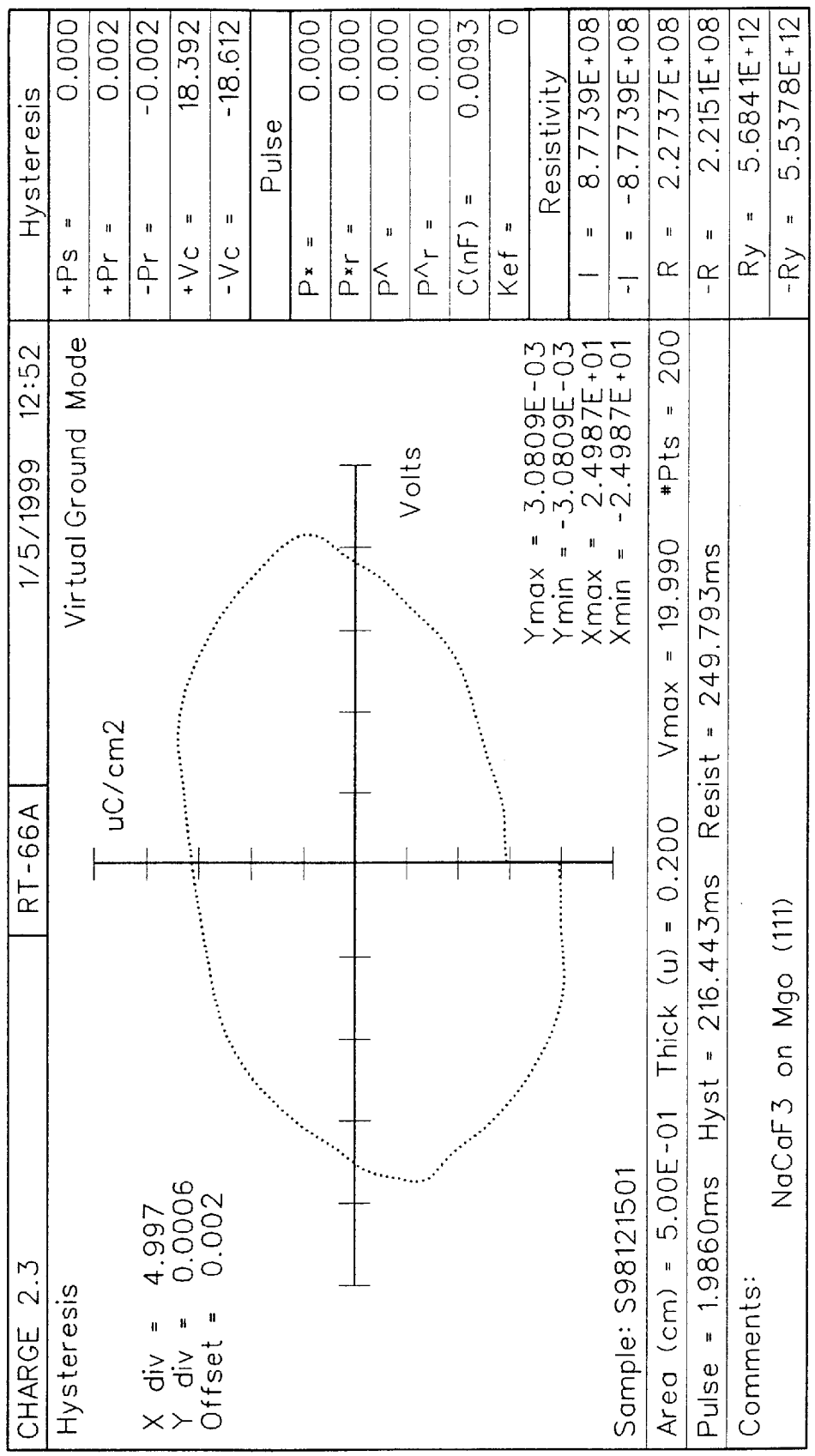
FIG. 1c shows a hysteresis curve for a fabricated $NaCaF_3$ thin film deposited atop a (111) orientation MgO substrate.

FIG. 1c is a hysteresis curve obtained using a Radiant Technologies RT66A Standardized Ferroelectric Test System.

Figure 2:
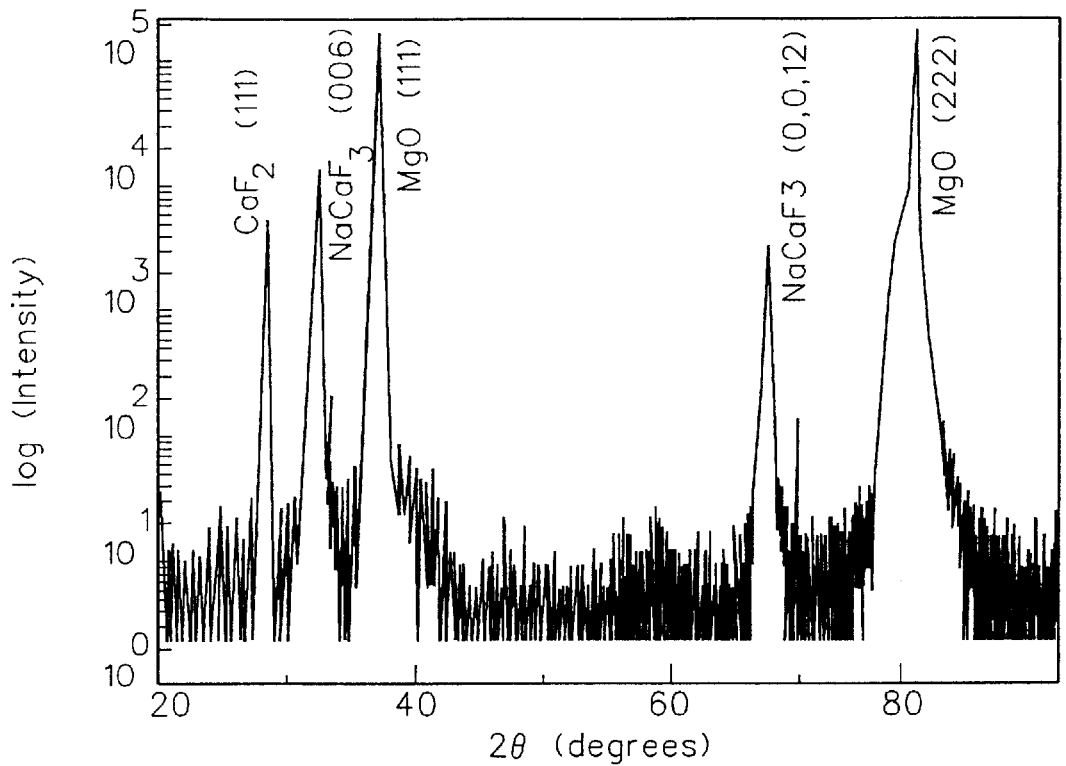
FIGS. 2–5 show various XRD 2θ-θ and ω-scan plots for a fabricated $NaCaF_3$ thin film deposited atop a (111) orientation MgO substrate.
Figure 3:
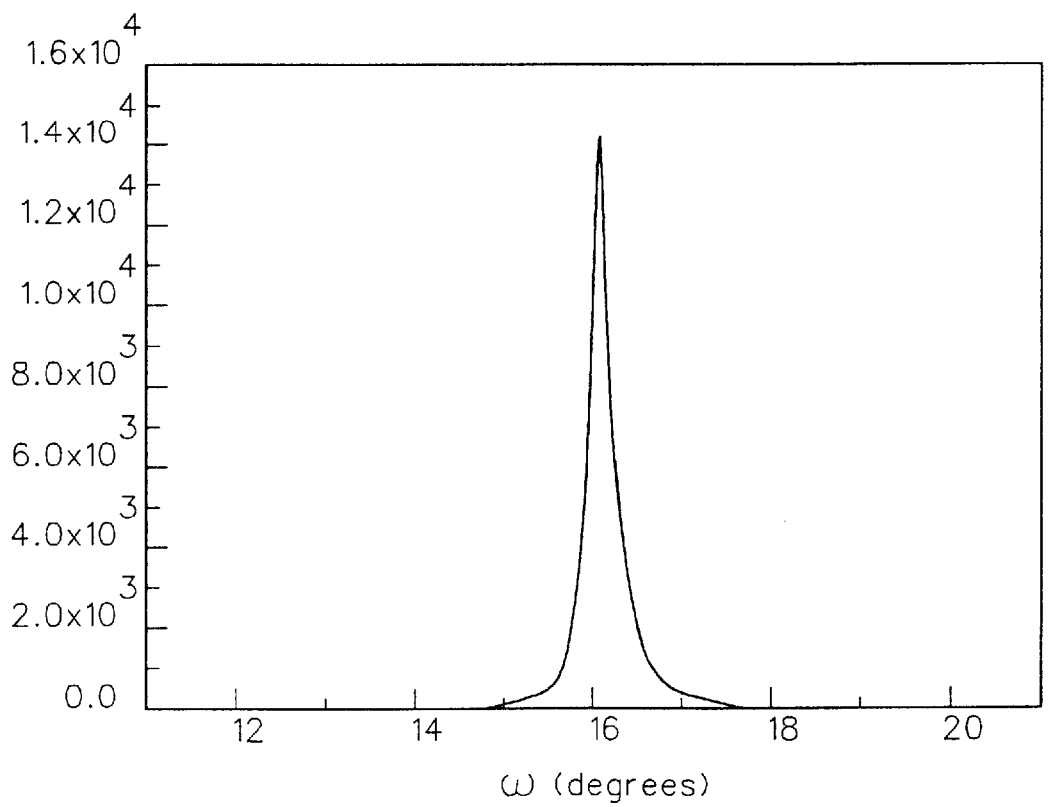

FIG. 2 shows the XRD pattern of $NaCaF_3$ reflections from a representative film. It is noted that the film is oriented with the c-axis oriented normal to the substrate surface and is textured as shown by the ω-scan of the (0 0 6) reflection as shown in FIG. 3 The 2 values of the (0 0 6) and (0 0 12) reflections are smaller than expected, reflecting a larger c-axis than is expected by calculation. Nonetheless, the proximity of the two peaks to the expected values is good. Also seen in FIG. 2, is parasitic (111) oriented $CaF_2$ which was found present on all films. The $CaF_2$ phase in the films is textured as evidenced by the strong (111) peak, which was found to have FWHM or about 0.7 degrees. The presence of said $CaF_2$ might be due to the high volatility of NaF at the deposition temperature and associated Na vacancies within the film.

Figure 4:
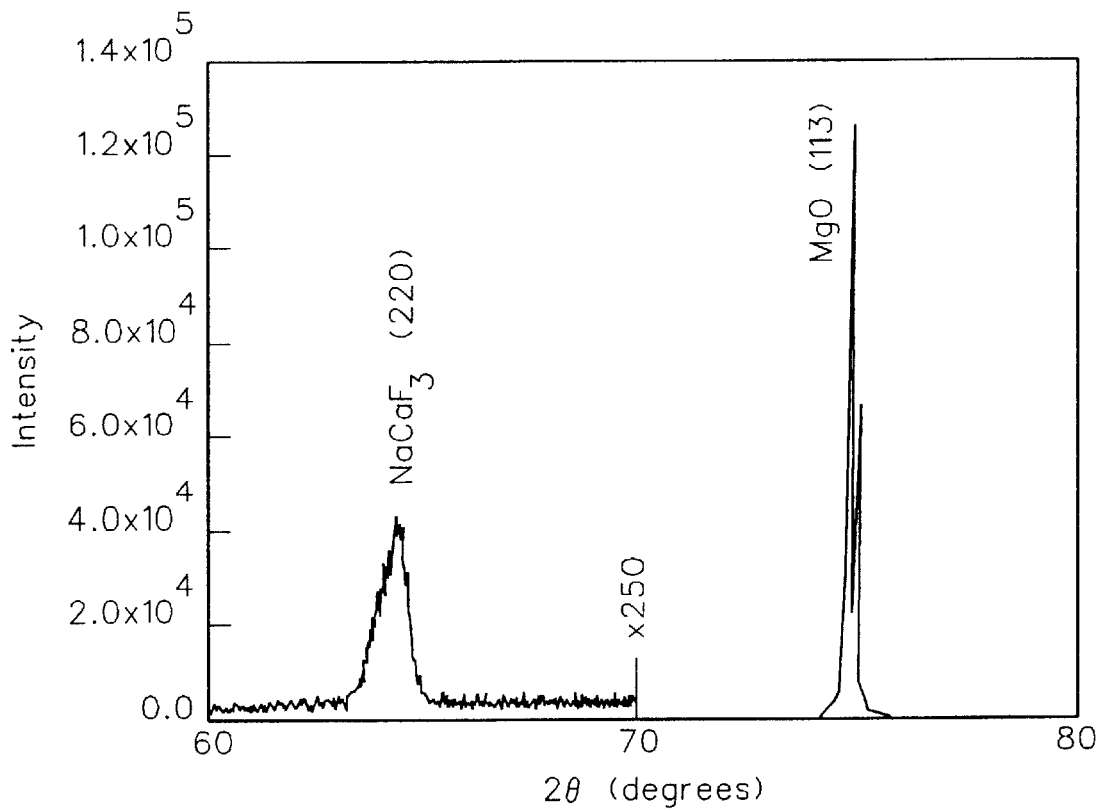
Figure 5:
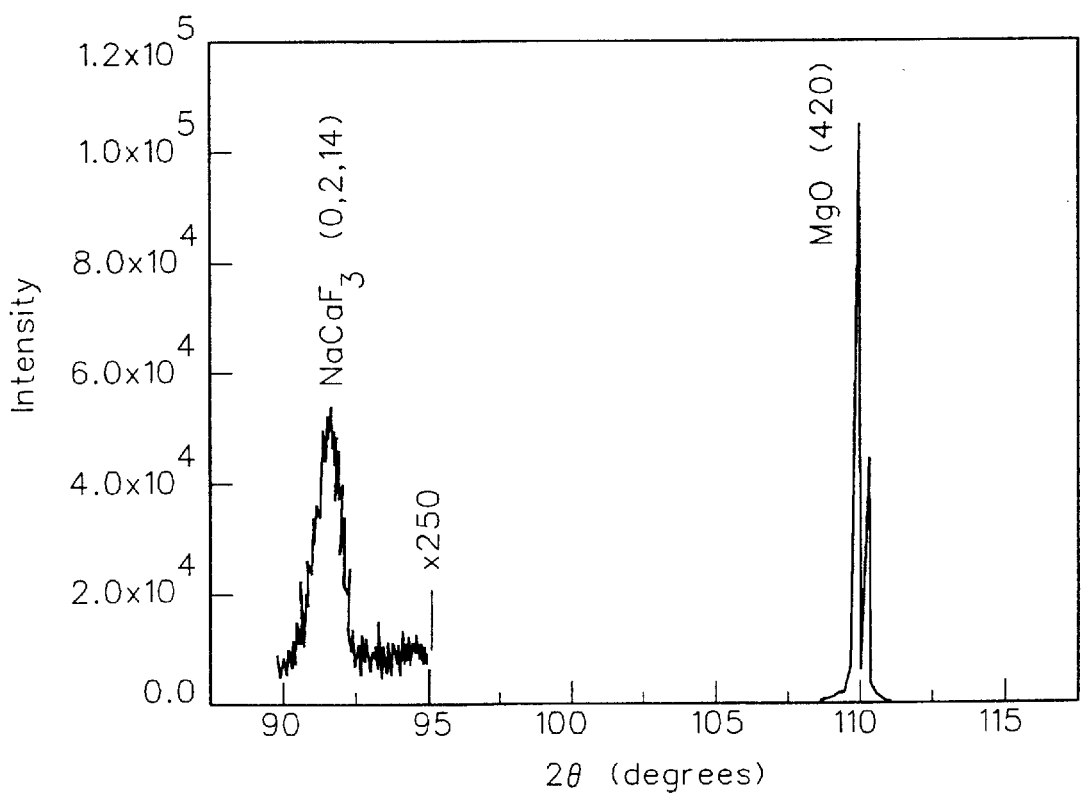

Data used to determine thee -cell parameter for $NaCaF_3$ were obtained from asymmetric XRD scans of the MgO (3 1 1) and (4 2 0) reflections. These scans detected the (2 2 0) and (0 2 14) reflections from the $NaCaF_2$ film as shown in FIGS. 4 and 5 respectively, indicating that the film is aligned in-plane. It is note that the values from all four measured reflections from the $NaCaF_3$ films were corrected based on reflections from the MgO substrate (α=4.2112 Angstroms), as the internal standard.

It is also disclosed that material solid solutions, other than $NaCaF_3$, have been fabricated. In particular $NaMgF_3$ and $Na_{1-x}K_xMgF_3$ have been fabricated by grinding and combining sodium fluoride, potassium fluoride and magnesium fluoride in desired stoichiometric ratios and heating said result in a platinum boat. Said materials have been investigated for temperature dependent phase transitions, (an example result being identification of a single orthorhombic to cubic transition at 1038 degrees K). Computations show that the transition temperature should decrease with potassium content, with a room temperature transition occurring where (x=0.35), and ((1−x)=0.65). However, it is noted that the materials so fabricated have not demonstrated ferroelectric properties.

Figure 6:
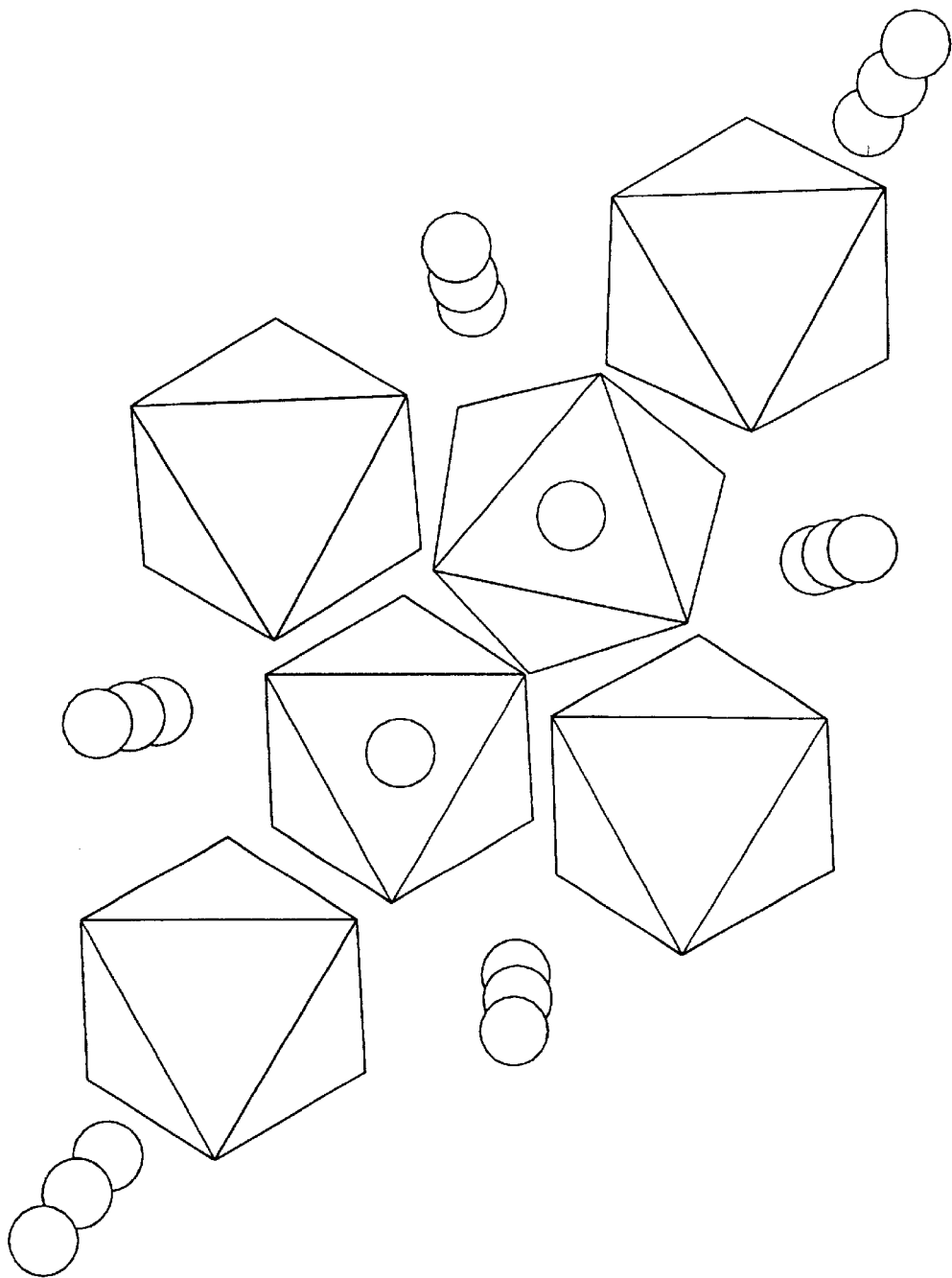
FIG. 6 shows the structure of $NaCaF_3$ looking down the rhombohedral axis, which is also the polarization axis.
Figure 7:
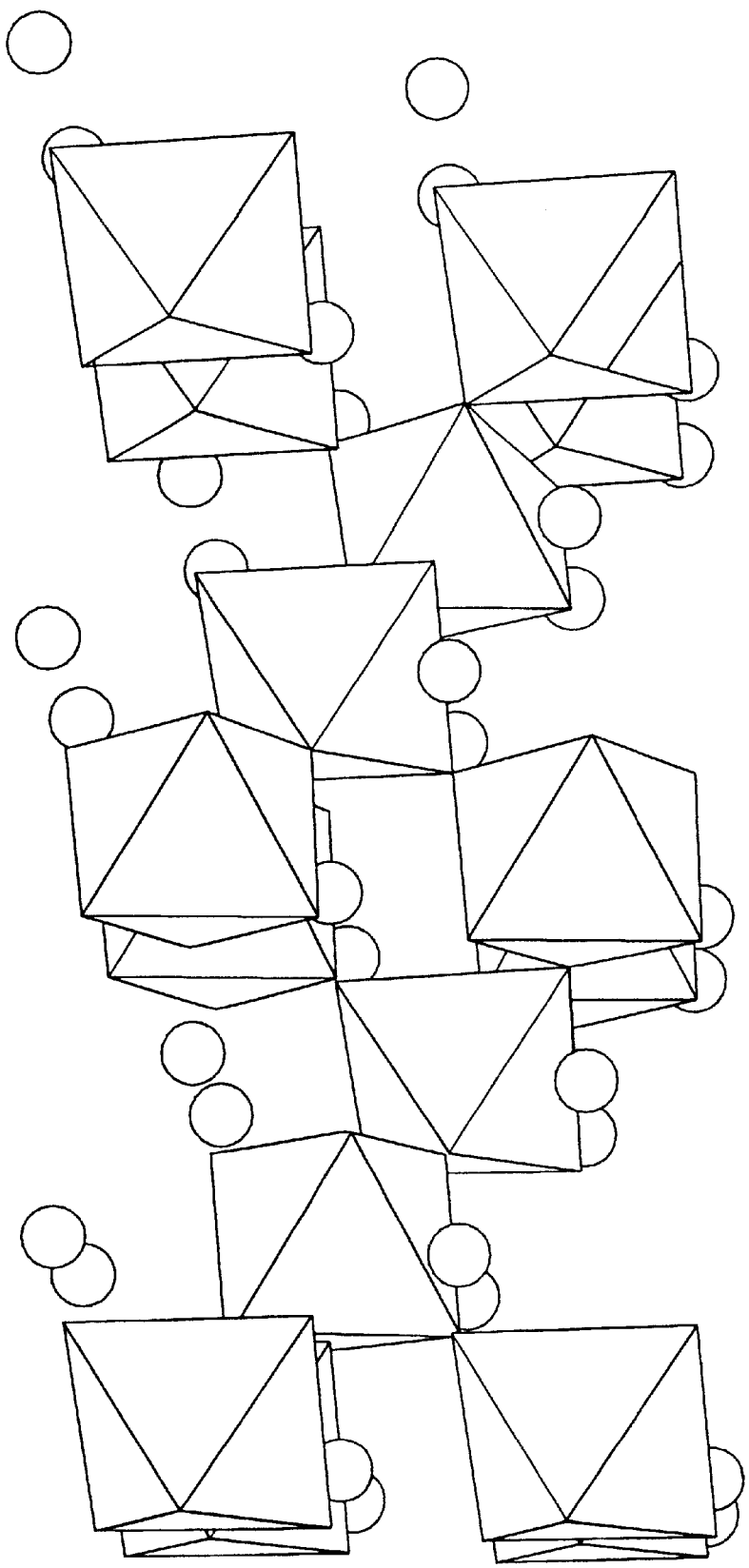
FIG. 7 shows the same $NaCaF_3$ structure as in FIG. 6, but rotated ninety (90) degrees, thereby positioning the rhombohedral axis oriented along the long side of the paper.

FIG. 6 shows the structure of $NaCaF_3$ looking down the rhombohedral axis, which is also the polarization axis. Trigonal symmetry is demonstrated. FIG. 7 shows the same structure rotated ninety (90) degrees, with the rhombohedral axis oriented along the long side of the paper. The Na atoms are the white spheres and the Figures illustrate Ca centered $CaF_6$ octahedra wherein the $Ca^{2+}$ are not visible as they are inside said octahedra.

Having hereby disclosed the subject matter of the present invention, it should be obvious that many modifications, substitutions, and variations of the present invention are possible in view of the teachings. It is therefore to be understood that the invention may be practiced other than as specifically described, and should be limited in its breadth and scope only by the Claims.

We claim:

1. A method of fabricating a ferroelectric material having a formula $A_{(1-x)}B_xC_{(1-y)}D_yF_3$, where A and B are each independently selected from Periodic Chart Group IA, and said C and D are each independently selected from Periodic Chart Group IIA, said ferroelectric material being in functional combination with a substrate with a substantially matched lattice constant; wherein "x" and "y" are both numbers between 0 and 1 inclusive;

said method comprising the steps of:
    a. providing a pulsed laser deposition system;
    b. placing target containing A and C, and optionally B and/or D into said pulsed laser deposition system;
    c. placing a selected substrate into said pulsed laser deposition system;
    d. causing pulses of laser energy to ablate said target containing A and C, and optionally B and/or D to the end that ablated A and C, and optionally B and/or D deposit onto said substrate.

2. A method of fabricating a ferroelectric material having a formula $A_{(1-x)}B_xC_{(1-y)}D_yF_3$, as in claim 1, wherein the step of placing target containing A and C, and optionally B and/or D into said pulsed laser deposition system involves selecting A, B, C and/or D such that;

A is Sodium (Na);
    x is 0.0;
    C is Calcium (Ca); and
    y is 0.0;
and involves selecting a substrate from the group consisting of:
    (111) orientation MgO;
    (111) orientation $SrZrO_3$;
    (111) orientation $SrTiO_3$;
    (111) orientation Au;
    a (111) orientation substrate with a cubic lattice constant between about 3.8 and 4.3 Angstroms; and
    a (001) orientation substrate with a hexagonal a-axis parameter of between about 5.4 and 6.2 Angstroms.

3. A method of fabricating a ferroelectric material having a formula $A_{(1-x)}B_xC_{(1-y)}D_yF_3$, as in claim 1, wherein the step of placing target containing A and C, and optionally B and/or D into said pulsed laser deposition system involves selecting A, B, C and/or D such that;

A is Sodium (Na);
    B is Potassium (K);
    x is between 0.0 and 1.0;
    C is Calcium (Ca); and
    D is selected from the group consisting of the Periodic Chart Group IIA elements; and
    y is between 0.0 and 1.0;
and involves selecting a substrate from the group consisting of:
    (111) orientation MgO;
    (111) orientation $SrZrO_3$;
    (111) orientation $SrTiO_3$;
    (111) orientation Au;
    a (111) orientation substrate with a cubic lattice constant between about 3.8 and 4.3 Angstroms; and
    a (001) orientation substrate with a hexagonal a-axis parameter of between about 5.4 and 6.2 Angstroms.

4. A method of fabricating a ferroelectric material having a formula $A_{(1-x)}B_xC_{(1-y)}D_yF_3$, wherein "x" and "y" are both numbers between 0 and 1 inclusive;

where A and B are selected from the group consisting of:
    each being independently selected from Periodic Chart Group IA; and
    one being selected from Periodic Chart Group IA and the other being absent;
and said C and D are selected from the group consisting of:
    each being independently selected from Periodic Chart Group IIA; and
    one being selected from Periodic Chart Group IIA and the other being absent;
said method comprising the steps of:
    a. providing a pulsed laser deposition system;
    b. placing target containing A and C, and optionally B and/or D into said pulsed laser deposition system;
    c. placing a selected substrate into said pulsed laser deposition, system;
    d. causing pulses of laser energy to ablate said target containing A and C, and optionally B and/or D to the end that ablated A and C, and optionally B and/or D deposit onto said substrate.

5. A method of fabricating a ferroelectric material having a formula $A_{(1-x)}B_xC_{(1-y)}D_yF_3$, wherein "x" and "y" are both numbers between 0 and 1 inclusive;

where A and B are selected from the group consisting of:
    each being independently selected from Periodic Chart Group IA; and
    one being selected from Periodic Chart Group IA and the other being absent;
and said C and D are selected from the group consisting of:
    each being independently selected from Periodic Chart Group IIA; and
    one being selected from Periodic Chart Group IIA and the other being absent;
which is characterized by X-ray diffraction fingerprint results corresponding to the presence of materials inherent in $$A_{(1-x)}B_xC_{(1-y)}D_yF_3$$

said method comprising the steps of:
    a. providing a pulsed laser deposition system;
    b. placing target containing A and C, and optionally B and/or D into said pulsed laser deposition system;
    c. placing a selected substrate into said pulsed laser deposition system;
    d. causing pulses of laser energy to ablate said target containing A and C, and optionally B and/or D to the end that ablated A and C, and optionally B and/or D deposit onto said substrate.

6. A method of fabricating a ferroelectric material having a formula $NaCaF_3$, said ferroelectric material being a thin film in functional combination with a surface of a substrate, said substrate being selected from the group consisting of:
    (111) orientation MgO;
    (111) orientation $SrZrO_3$;

(111) orientation SrTiO$_3$;

(111) orientation Au;

a (111) orientation substrate with a cubic lattice constant between about 3.8 and 4.3 Angstroms; and a (001) orientation substrate with a hexagonal a-axis parameter of between about 5.4 and 6.2 Angstroms;

said method comprising the steps of:

a. providing a pulsed laser deposition system;

b. placing target containing Na and Ca into said pulsed laser deposition system;

c. placing a selected substrate into said pulsed laser deposition system;

d. causing pulses of laser energy to ablate said target containing Na and Ca, to the end that ablated Na and Ca deposit onto said substrate.

7. A method of fabricating a ferroelectric material having a formula KCaF$_3$, said ferroelectric material being a thin film in functional combination with a surface of a substrate, said substrate being selected from the group consisting of:

(111) orientation MgO;

(111) orientation SrZrO$_3$;

(111) orientation SrTiO$_3$;

(111) orientation Au;

a (111) orientation substrate with a cubic lattice constant between about 3.8 and 4.3 Angstroms; and a (001) orientation substrate with a hexagonal a-axis parameter of between about 5.4 and 6.2 Angstroms;

said method comprising the steps of:

a. providing a pulsed laser deposition system;

b. placing target containing K and Ca into said pulsed laser deposition system;

c. placing a selected substrate into said pulsed laser deposition system;

d. causing pulses of laser energy to ablate said target containing K and Ca, to the end that ablated K and Ca deposit onto said substrate.

8. A method of fabricating a ferroelectric material having a formula Na$_{(1-x)}$K$_x$CaF$_3$, wherein "x" and "y" are both numbers between 0 and 1 inclusive; said ferroelectric material being a thin film in functional combination with a surface of a substrate, said substrate being selected from the group consisting of:

(111) orientation MgO;

(111) orientation SrZrO$_3$;

(111) orientation SrTiO$_3$;

(111) orientation Au;

a (111) orientation substrate with a cubic lattice constant between about 3.8 and 4.3 Angstroms; and a (001) orientation substrate with a hexagonal a-axis parameter of between about 5.4 and 6.2 Angstroms;

said method comprising the steps of:

a. providing a pulsed laser deposition system;

b. placing target containing Na and/or K and Ca into said pulsed laser deposition system;

c. placing a selected substrate into said pulsed laser deposition system;

d. causing pulses of laser energy to ablate said target containing Na and/or K and Ca, to the end that ablated Na and/or K and Ca deposit onto said substrate.

9. A method of fabricating a ferroelectric material having a formula A$_{(1-x)}$B$_x$C$_{(1-y)}$D$_y$F$_3$; wherein "x" and "y" are numbers between 0 and 1 inclusive;

where A and B are each characterized by a selection from the group consisting of:

each being independently selected from Periodic Chart Group IA; and one being selected from Periodic Chart Group IA and the other being absent;

and said C and D are each characterized by a selection from the group consisting of:

each being independently selected from Periodic Chart Group IIA;

one being selected from Periodic Chart Group IIA and the other being absent;

said ferroelectric material being in functional combination with a subtrate selected from the group consisting of:

a (111) orientation substrate with a cubic lattice constant between about 3.8 and 4.3 Angstroms; and a (001) orientation substrate with a hexagonal a-axis parameter of between about 5.4 and 6.2 Angstroms;

said method comprising the steps of:

a. providing a pulsed laser deposition system;

b. placing target containing A and C, and optionally B and/or D into said pulsed laser deposition system;

c. placing a selected subtrate into said pulsed laser deposition system;

d. causing pulses of laser energy to ablate said target containing A and C, and optionally B and/or D to the end that ablated A and C, and optional B and/or D deposit onto said subtracted.

\* \* \* \* \*